(12) United States Patent
Nam et al.

(10) Patent No.: US 10,763,563 B2
(45) Date of Patent: Sep. 1, 2020

(54) RADIO FREQUENCY FILTER AND RADIO FREQUENCY MODULE

(71) Applicant: Samsung Electro-Mechanics Co., Ltd., Suwon-si (KR)

(72) Inventors: Joong Jin Nam, Suwon-si (KR); Kyu Bum Han, Suwon-si (KR); Jae Soon Lee, Suwon-si (KR); Young Kyoon Im, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 36 days.

(21) Appl. No.: 16/176,053

(22) Filed: Oct. 31, 2018

(65) Prior Publication Data

US 2020/0007103 A1 Jan. 2, 2020

(30) Foreign Application Priority Data

Jun. 29, 2018 (KR) .................... 10-2018-0075307

(51) Int. Cl.
*H01P 1/203* (2006.01)
*H03H 7/01* (2006.01)
(Continued)

(52) U.S. Cl.
CPC .......... *H01P 1/203* (2013.01); *H01L 23/5386* (2013.01); *H01L 23/552* (2013.01);
(Continued)

(58) Field of Classification Search
CPC ... H01P 1/203; H01P 1/20327; H03H 7/0115; H03H 1/0007
(Continued)

(56) References Cited

U.S. PATENT DOCUMENTS

2003/0231084 A1* 12/2003 Yahata ................ H01P 1/20381
333/204
2005/0253671 A1* 11/2005 Hamada .............. H01P 1/20381
333/204
(Continued)

FOREIGN PATENT DOCUMENTS

JP 2002-100698 A 4/2002
JP 2015-111748 A 6/2015

*Primary Examiner* — Rakesh B Patel
(74) *Attorney, Agent, or Firm* — NSIP Law

(57) ABSTRACT

A radio frequency filter includes a first conductive pattern; a second conductive pattern connected to a first point of the first conductive pattern and extended; a third conductive pattern connected to a second point of the first conductive pattern and extended to surround a portion of the second conductive pattern; a fourth conductive pattern; a fifth conductive pattern connected to a third point of the fourth conductive pattern and extended; and a sixth conductive pattern connected to a fourth point of the fourth conductive pattern and extended to surround a portion of the fifth conductive pattern. The first conductive pattern extends toward the fourth conductive pattern and the fourth conductive pattern extends toward the first conductive pattern. A distance between the first conductive pattern and the fourth conductive pattern is greater than or equal to a distance between the third conductive pattern and the sixth conductive pattern.

13 Claims, 14 Drawing Sheets

(51) Int. Cl.
　　　*H03H 1/00* 　　　(2006.01)
　　　*H01L 23/66* 　　　(2006.01)
　　　*H01Q 21/06* 　　　(2006.01)
　　　*H05K 1/02* 　　　(2006.01)
　　　*H05K 9/00* 　　　(2006.01)
　　　*H01L 23/552* 　　　(2006.01)
　　　*H01L 23/538* 　　　(2006.01)
　　　*H01L 25/16* 　　　(2006.01)

(52) U.S. Cl.
　　　CPC .......... *H01L 23/66* (2013.01); *H01P 1/20327* (2013.01); *H01Q 21/065* (2013.01); *H03H 1/0007* (2013.01); *H03H 7/0115* (2013.01); *H05K 1/0225* (2013.01); *H05K 1/0253* (2013.01); *H05K 9/0064* (2013.01); *H01L 23/5383* (2013.01); *H01L 23/5384* (2013.01); *H01L 25/16* (2013.01); *H01L 2223/6616* (2013.01); *H01L 2223/6627* (2013.01); *H01L 2223/6677* (2013.01); *H03H 2001/0085* (2013.01); *H05K 2201/09254* (2013.01)

(58) Field of Classification Search
　　　USPC .................................................. 333/204, 205
　　　See application file for complete search history.

(56) References Cited

U.S. PATENT DOCUMENTS

2009/0273517 A1* 11/2009 Thiesen ............... H01Q 3/2605
　　　　　　　　　　　　　　　　　　　　　　342/372
2015/0119104 A1　　4/2015　Saji et al.

\* cited by examiner

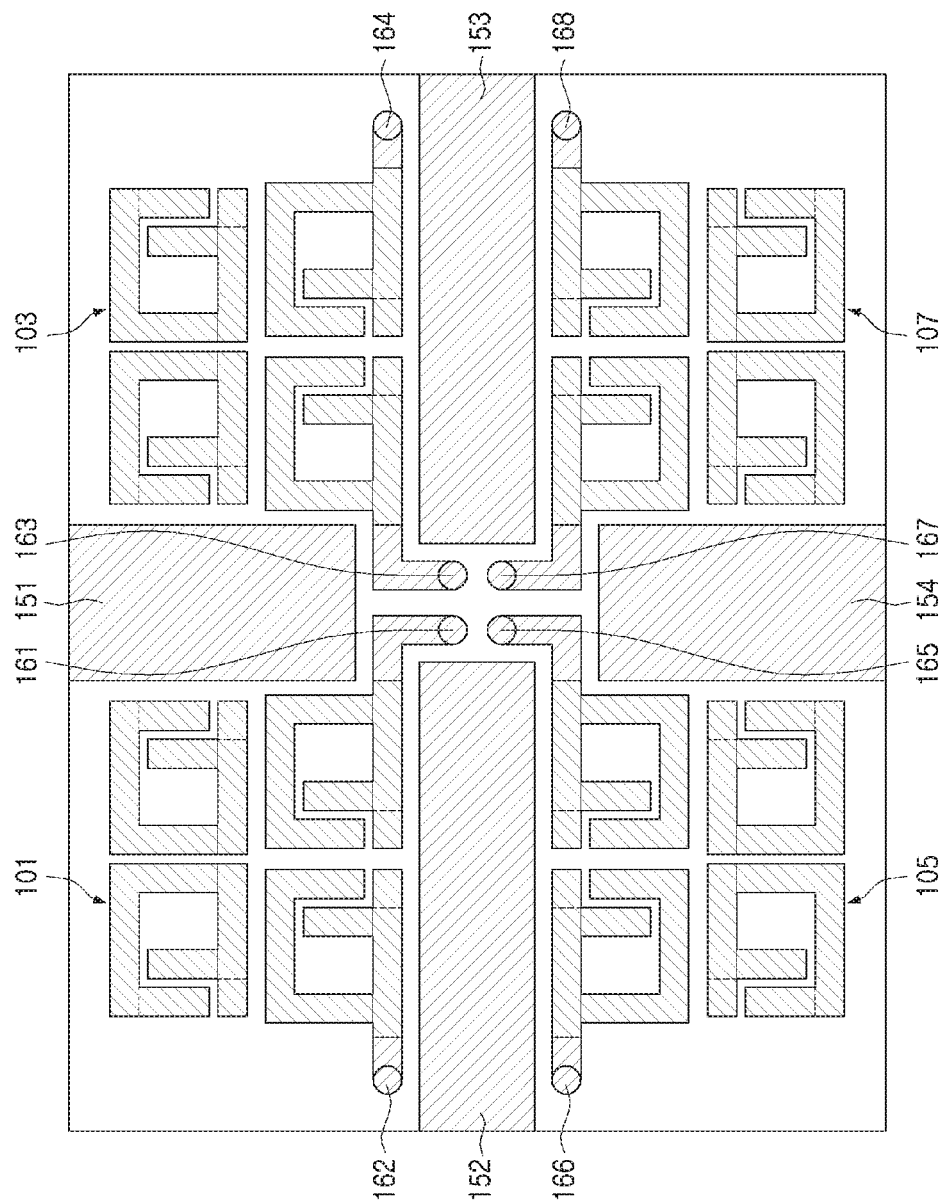

RADIO FREQUENCY FILTER AND RADIO FREQUENCY MODULE

CROSS-REFERENCE TO RELATED APPLICATIONS

This application claims the benefit under 35 USC 119(a) of Korean Patent Application No. 10-2018-0075307 filed on Jun. 29, 2018 in the Korean Intellectual Property Office, the entire disclosure of which is incorporated herein by reference for all purposes.

BACKGROUND

1. Field

The following description relates to a radio frequency filter and a radio frequency module.

2. Description of the Related Art

Mobile communications data traffic is rapidly increasing every year. Technological developments are being actively conducted to support such rapidly increasing data in real time in a wireless network. For example, applications such as the contents of IoT (Internet of Things) based data, augmented reality (AR), virtual reality (VR), live VR/AR combined with SNS, autonomous driving, sync view (a real time image of a user point of view transmitted using an ultra-small camera), and the like, require communications (e.g., 5G communications, mmWave communications, etc.) for supporting transmission and reception of large amounts of data.

Therefore, recently, millimeter wave (mmWave) communications including 5th wave (5G) communications have been researched, and research into the commercialization/standardization of a module that smoothly implements millimeter wave communications is also being performed.

However, a radio frequency filter that efficiently filters RF signals in high frequency bands (e.g., 24 GHz, 28 GHz, 36 GHz, 39 GHz, 60 GHz, and the like) has not yet been suggested or developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency filter includes a first conductive pattern extended from a first port and including a first point and a second point; a second conductive pattern connected to the first point of the first conductive pattern and extended from the first point; a third conductive pattern connected to the second point of the first conductive pattern and extended to surround at least a portion of the second conductive pattern; a fourth conductive pattern extended from a second port and including a third point and a fourth point; a fifth conductive pattern connected to the third point of the fourth conductive pattern and extended from the third point; and a sixth conductive pattern connected to the fourth point of the fourth conductive pattern and extended to surround at least a portion of the fifth conductive pattern. The first conductive pattern extends toward the fourth conductive pattern from the first point and the fourth conductive pattern extends toward the first conductive pattern from the third point. A separation distance between the first conductive pattern and the fourth conductive pattern is greater than or equal to a separation distance between the third conductive pattern and the sixth conductive pattern.

A length of an extended portion of the first conductive pattern that extends toward the fourth conductive pattern from the first point may be shorter than a distance between the first point and the second point, and a length of an extended portion of the fourth conductive pattern that extends toward the first conductive pattern from the third point may be shorter than a distance between the third point and the fourth point.

A width of the first conductive pattern may be greater than a separation distance between the second conductive pattern and the third conductive pattern in a first lateral direction, and may be less than a separation distance between the second conductive pattern and the third conductive pattern in a second lateral direction. A width of the fourth conductive pattern may be greater than a separation distance between the fifth conductive pattern and the sixth conductive pattern in a third lateral direction, and may be less than a separation direction between the fifth conductive pattern and the sixth conductive pattern in a fourth lateral direction.

A separation distance between one end of the second conductive pattern and the third conductive pattern may be equal to a separation distance between the second conductive pattern and the third conductive pattern in a first lateral direction, and a separation distance between one end of the fifth conductive pattern and the sixth conductive pattern may be equal to a separation distance between the fifth conductive pattern and the sixth conductive pattern in a second lateral direction.

A separation distance between one end of the third conductive pattern and the first conductive pattern may be equal to a separation distance between the second conductive pattern and the third conductive pattern in a first lateral direction, and a separation distance between one end of the sixth conductive pattern and the fourth conductive pattern may be equal to a separation distance between the fifth conductive pattern and the sixth conductive pattern in a second lateral direction.

A separation distance between the third conductive pattern and the sixth conductive pattern may be greater than the separation distance between the second conductive pattern and the third conductive pattern in the first lateral direction, and may be greater than the separation distance between the fifth conductive pattern and the sixth conductive pattern in the second lateral direction.

A seventh conductive pattern may be electromagnetically coupled to at least a portion of the third conductive pattern, and an eighth conductive pattern may be electromagnetically coupled to at least a portion of the sixth conductive pattern. A separation distance between the seventh conductive pattern and the eighth conductive pattern may be less than or equal to the separation distance between the first conductive pattern and the fourth conductive pattern.

A ninth conductive pattern may be connected to a fifth point of the seventh conductive pattern and extended from the fifth point, a tenth conductive pattern may be connected to a sixth point of the seventh conductive pattern and extended to surround at least a portion of the ninth conductive pattern, an eleventh conductive pattern may be connected to a seventh point of the eighth conductive pattern and extended from the seventh point, and a twelfth conductive pattern may be connected to an eighth point of the eighth conductive pattern and extended to surround at least a portion of the eleventh conductive pattern. A separation distance between the tenth conductive pattern and the twelfth conductive pattern may be less than or equal to the separation distance between the third conductive pattern and the sixth conductive pattern.

A distance from one end of the seventh conductive pattern to the fifth point may be less than a distance from the fifth point to the sixth point, and a distance from one end of the eighth conductive pattern to the seventh point may be less than a distance from the seventh point to the eighth point.

A separation distance between the third conductive pattern and the seventh conductive pattern may be greater than a separation distance between the tenth conductive pattern and the twelfth conductive pattern and may be less than the separation distance between third conductive pattern and the sixth conductive pattern. A separation distance between the sixth conductive pattern and the eighth conductive pattern may be greater than the separation distance between the tenth conductive pattern and the twelfth conductive pattern and may be less than the separation distance between third conductive pattern and the sixth conductive pattern.

In another general aspect, a radio frequency filter includes a first conductive pattern extended from a first port and including a first point and a second point; a second conductive pattern connected to the first point of the first conductive pattern and extended from the first point; a third conductive pattern connected to the second point of the first conductive pattern and extended to surround at least a portion of the second conductive pattern; a fourth conductive pattern extended from a second port and including a third point and a fourth point; a fifth conductive pattern connected to the third point of the fourth conductive pattern and extended from the third point; a sixth conductive pattern connected to the fourth point of the fourth conductive pattern and extended to surround at least a portion of the fifth conductive pattern; a seventh conductive pattern electromagnetically coupled to at least a portion of the third conductive pattern; and an eighth conductive pattern electromagnetically coupled to at least a portion of the sixth conductive pattern. A separation distance between the seventh conductive pattern and the eighth conductive pattern is less than or equal to a separation distance between the third conductive pattern and the sixth conductive pattern.

A ninth conductive pattern may be connected to a fifth point of the seventh conductive pattern and extended from the fifth point, a tenth conductive pattern may be connected to a sixth point of the seventh conductive pattern and extended to surround at least a portion of the ninth conductive pattern, an eleventh conductive pattern may be connected to a seventh point of the eighth conductive pattern and extended from the seventh point, and a twelfth conductive pattern may be connected to an eighth point of the eighth conductive pattern and extended to surround at least a portion of the eleventh conductive pattern. A separation distance between the tenth conductive pattern and the twelfth conductive pattern may be less than or equal to the separation distance between the third conductive pattern and the sixth conductive pattern.

A separation distance between the third conductive pattern and the seventh conductive pattern may be greater than the separation distance between the tenth conductive pattern and the twelfth conductive pattern and may be less than the separation distance between third conductive pattern and the sixth conductive pattern. A separation distance between the sixth conductive pattern and the eighth conductive pattern may be greater than the separation distance between the tenth conductive pattern and the twelfth conductive pattern and may be less than the separation distance between third conductive pattern and the sixth conductive pattern.

In another general aspect, a radio frequency module includes an integrated circuit (IC); an antenna layer including patch antennas electrically connected to the IC, respectively; and a filter layer including radio frequency filters electrically connected to corresponding patch antennas, respectively, and disposed between the IC and the antenna layer. At least one of the radio frequency filters includes a first conductive pattern extended from a first port and including a first point and a second point; a second conductive pattern connected to the first point of the first conductive pattern and extended from the first point; a third conductive pattern connected to the second point of the first conductive pattern and extended to surround at least a portion of the second conductive pattern; a fourth conductive pattern extended from a second port and including a third point and a fourth point; a fifth conductive pattern connected to the third point of the fourth conductive pattern and extended from the third point; and a sixth conductive pattern connected to the fourth point of the fourth conductive pattern and extended to surround at least a portion of the fifth conductive pattern. The first conductive pattern extends toward the fourth conductive pattern from the first point and the fourth conductive pattern extends toward the first conductive pattern from the third point, and a separation distance between the first conductive pattern and the fourth conductive pattern is greater than or equal to a separation distance between the third conductive pattern and the sixth conductive pattern.

A core member may be configured to pass a base signal, and the IC may receive the base signal through the core member and may transmit a radio frequency signal having a frequency higher than a frequency of the base signal to the patch antennas.

An upper ground layer may be disposed between the antenna layer and the filter layer and may overlap the radio frequency filters in a vertical direction, and a lower ground layer may be disposed between the filter layer and the IC and may overlap the radio frequency filters in the vertical direction.

An electronic device may include the radio frequency module and a communications module electrically connected to the radio frequency module.

Other features and aspects will be apparent from the following detailed description, the drawings, and the claims.

BRIEF DESCRIPTION OF DRAWINGS

FIG. 5 is a diagram illustrating a filter layer on which a radio frequency filter according to an example is arranged.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
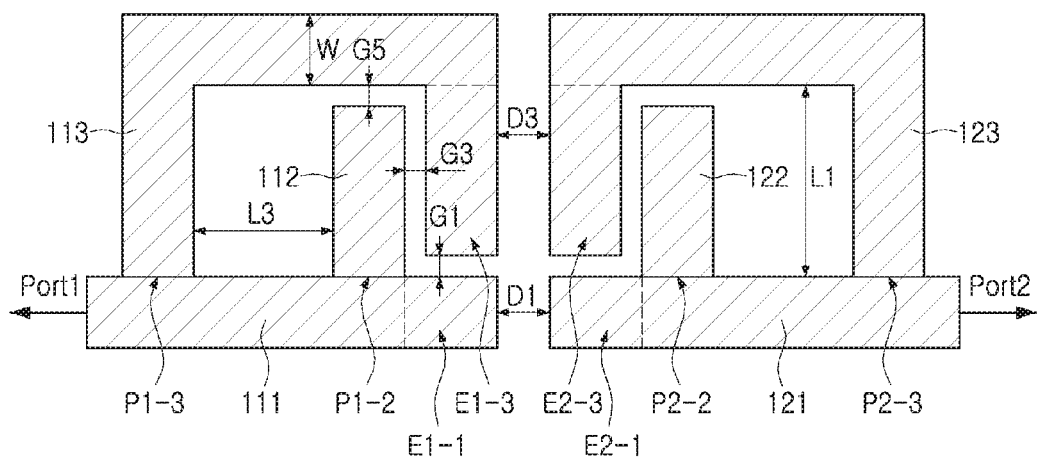
FIG. 1 is a diagram illustrating a radio frequency filter according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating a radio frequency filter according to an example.

Referring to FIG. 1, a radio frequency filter may include a first conductive pattern 111, a second conductive pattern 112, a third conductive pattern 113, a fourth conductive pattern 121, a fifth conductive pattern 122, and a sixth conductive pattern 123.

The first conductive pattern 111 may extend from a first port Port 1.

The second conductive pattern 112 may be connected to a first point P1-2 of the first conductive pattern 111 and be extended therefrom.

The third conductive pattern 113 may be connected to a second point P1-3 of the first conductive pattern 111 and extend to surround at least a portion of the second conductive pattern 112. A width W of the third conductive pattern 113 may be equal to the width of the first conductive pattern 111 and may be equal to the width of the second conductive pattern 112, but may be varied depending on a resonance frequency design. For example, the width W may be about 0.21 mm, but is not limited to such a width.

A radio frequency signal transmitted from the first port Port1 may be branched at the second point P1-3 of the first conductive pattern 111. A path from the second point P1-3 to the second conductive pattern 112 and a path from the second point P1-3 to the third conductive pattern 113 may each act as an inductance. The inductance may be determined according to a distance L3 between the first point P1-2 and the second point P1-3, and a longitudinal length L1 of the third conductive pattern 113. For example, the distance L3 between the first point P1-2 and the second point P1-3 may be about 0.36 mm and the longitudinal length L1 of the third conductive pattern 113 may be about 0.4 mm, but are not limited to such a configuration.

The second conductive pattern 112 and the third conductive pattern 113 may be electromagnetically coupled to each other. A space between the second conductive pattern 112 and the third conductive pattern 113 may act as a capacitance. The capacitance may be determined according to a lateral separate distance G3 of the second conductive pattern 112 to the third conductive pattern 113.

The fourth conductive pattern 121 may extend from a second port Port 2. The fourth conductive pattern 121 and the first conductive pattern 111 may have bilateral symmetry with respect to each other, but may have bilateral asymmetry depending on a resonance frequency design.

The fifth conductive pattern 122 may be connected to a third point P2-2 of the fourth conductive pattern 121 and be extended therefrom. The fifth conductive pattern 122 and the second conductive pattern 112 may have bilateral symmetry with respect to each other, but may have bilateral asymmetry depending on a resonance frequency design.

The sixth conductive pattern 123 may be connected to a fourth point P2-3 of the fourth conductive pattern 121 and extend to surround at least a portion of the fifth conductive pattern 122. The sixth conductive pattern 123 and the third conductive pattern 113 may have bilateral symmetry with respect to each other, but may have bilateral asymmetry depending on a resonance frequency design.

A radio frequency signal transmitted from the second port Port2 may be branched at the fourth point P2-3 of the fourth conductive pattern 121. A path from the fourth point P2-3 to the fifth conductive pattern 122 and a path from the fourth point P2-3 to the sixth conductive pattern 123 may each act as an inductance.

The fifth conductive pattern 122 and the sixth conductive pattern 123 may be electromagnetically coupled to each other. A space between the fifth conductive pattern 122 and the sixth conductive pattern 123 may act as a capacitance.

The third conductive pattern 113 and the sixth conductive pattern 123 may be electromagnetically coupled to each other. A space between the third conductive pattern 113 and the sixth conductive pattern 123 may act as a capacitance.

The radio frequency filter may have a bandwidth based on a combination of a plurality of resonance frequencies determined by the capacitance and the inductance. Radio frequency signals of frequencies within the bandwidth may pass through between the first port Port1 and the second port Port2, and noises of frequencies out of the bandwidth may be filtered.

One boundary of the bandwidth may correspond to a first resonance frequency determined according to a combination of some capacitance and some inductance, and the other boundary of the bandwidth may correspond to a second resonance frequency determined according to a combination of some other capacitance and some other inductance.

The radio frequency signals close to the boundaries of the bandwidth may be slightly filtered, and the noises close to the boundaries of the bandwidth may be slightly passed. The radio frequency filter may have skirt characteristic corresponding to a rate of change in filtering according to a change in frequency at the boundaries of the bandwidth.

The radio frequency filter may have an additional resonance frequency close to the first and second resonance frequencies so as to pass the radio signals close to the boundaries of the bandwidth more efficiently, and to filter the noises close to the boundaries of the bandwidth more efficiently. The skirt characteristic of the radio frequency filter may be further improved.

The first conductive pattern 111 and the fourth conductive pattern 121 may be extended to each other from the first point P1-2 and the third point P2-2, respectively, and may be extended so that a separation distance D1 therebetween is greater than or equal to a separation distance D3 between the third conductive pattern 113 and the sixth conductive pattern 123. For example, the separation distance D3 between the third conductive pattern 113 and the sixth conductive pattern 123 may be about 0.125 mm, but is not limited to such a configuration.

The first conductive pattern 111 and the third conductive pattern 113 may be electromagnetically coupled to each other, the first conductive pattern 111 and the fourth conductive pattern 121 may be electromagnetically coupled to each other, and the fourth conductive pattern 121 and the sixth conductive pattern 123 may be electromagnetically coupled to each other. An extended region E1-1 of the first conductive pattern 111 and an extended region E2-1 of the fourth conductive pattern 121 may provide an additional capacitance.

The radio frequency filter may have an additional resonance frequency based on the additional capacitance to thereby have more improved skirt characteristic.

The additional capacitance may be varied depending on an extended length of the extended region E1-1 of the first conductive pattern 111 and an extended length of the extended region E2-1 of the fourth conductive pattern 121. The additional capacitance may be varied depending on an extended length of an extended region E1-3 of the third conductive pattern 113 and an extended length of an extended region E2-3 of the sixth conductive pattern 123.

Since the additional capacitance may be determined according to a separation distance G1 in a direction extending from one end of the third conductive pattern 113 to the first conductive pattern 111, the additional capacitance may be more finely adjusted. Therefore, the radio frequency filter may have a more finely adjusted bandwidth.

An overall size of the radio frequency filter may not be substantially increased even if the extended region E1-1 of the first conductive pattern 111 and the extended region E2-1 of the fourth conductive pattern 121 are added.

Since the radio frequency filter may have the additional capacitance without substantially increasing the overall size, the radio frequency filter may have improved filter performance over the size. Therefore, the radio frequency filter may be more efficiently disposed on a radio frequency module.

Figure 2A:
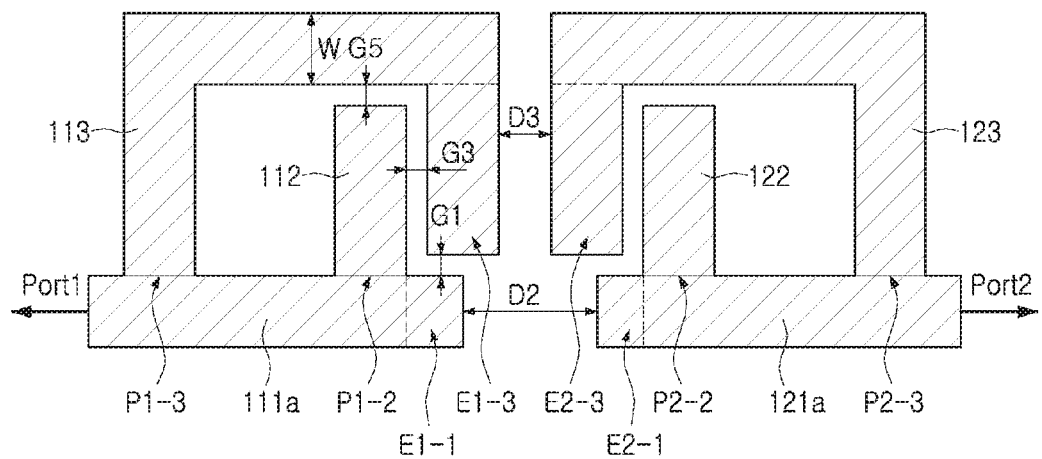
FIG. 2A is a diagram illustrating a radio frequency filter according to an example.

FIG. 2A is a diagram illustrating a radio frequency filter according to an example.

Referring to FIG. 2A, an extended region E1-1 of a first conductive pattern 111a may be shorter (as compared to the example of FIG. 1) and an extended region E2-1 of a fourth conductive pattern 121a may be shorter (as compared to the example of FIG. 1). A separation distance D2 between the first conductive pattern 111a and the fourth conductive pattern 121a may be longer (as compared to the example of FIG. 1).

A capacitance according to the extended region E1-1 of the first conductive pattern 111a and a capacitance according to the extended region E2-1 of the fourth conductive pattern 121a may be reduced.

A separation distance G1 in a direction extending from one end of the third conductive pattern 113 to the first conductive pattern 111a and a separation distance G3 in a direction extending between the second conductive pattern 112 and the third conductive pattern 113 may be equal to each other, and a separation distance in a direction extending from one end of the sixth conductive pattern 123 to the fourth conductive pattern 121a and a separation distance in a direction extending between the fifth conductive pattern 122 and the sixth conductive pattern 123 may be equal to each other.

A capacitance change rate according to an extended length of the extended region E1-1 of the first conductive pattern 111a and a capacitance change rate according to an extended length of the extended region E2-1 of the fourth conductive pattern 121a may each be stable. The radio frequency filter may have a more stable bandwidth.

Figure 2B:
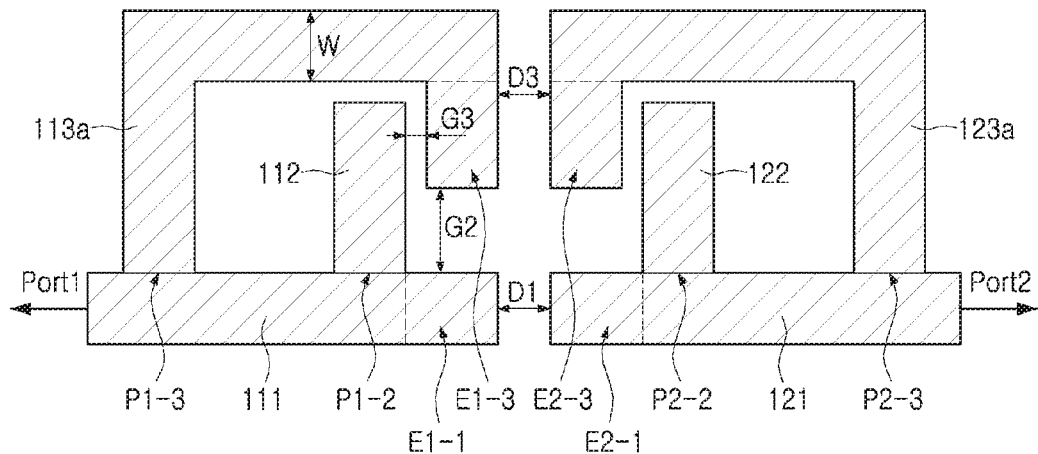
FIG. 2B is a diagram illustrating a radio frequency filter according to an example.

FIG. 2B is a diagram illustrating a radio frequency filter according to an example.

Referring to FIG. 2B, an extended region E1-3 of a third conductive pattern 113a may be shorter (as compared to the example of FIG. 1) and an extended region E2-3 of a sixth conductive pattern 123a may be shorter (as compared to the example of FIG. 1). A separation distance G2 in a direction extending from one end of the third conductive pattern 113a to the first conductive pattern 111 and a separation distance in a direction extending from one end of the sixth conductive pattern 123a to the fourth conductive pattern 121 may each be longer (as compared to the example of FIG. 1).

A capacitance between the second conductive pattern 112 and the third conductive pattern 113a may be reduced, and a capacitance between the fifth conductive pattern 122 and the sixth conductive pattern 123a may be reduced. Accordingly, some resonance frequency may be shifted.

A capacitance change rate according to a change in an extended length of an extended region E1-1 of the first conductive pattern 111 may be further reduced and a capacitance change rate according to a change in an extended length of an extended region E2-1 of the fourth conductive pattern 121 may be further reduced. That is, the radio frequency filter may have a more finely adjusted bandwidth.

A separation distance G5 in a direction extending from one end of the second conductive pattern 112 to the third conductive pattern 113a and a separation distance G3 in a lateral direction of the second conductive pattern 112 may be equal to each other, and a separation distance in a direction extending from one end of the fifth conductive pattern 122 to the sixth conductive pattern 123a and a separation distance in a lateral direction of the fifth conductive pattern 122 may be equal to each other.

Since the second conductive pattern 112 and the third conductive pattern 113a may be more stably coupled to each other, stable impedance may result. Since the fifth conductive pattern 122 and the sixth conductive pattern 123a may be more stably coupled to each other, stable impedance may result.

Figure 2C:
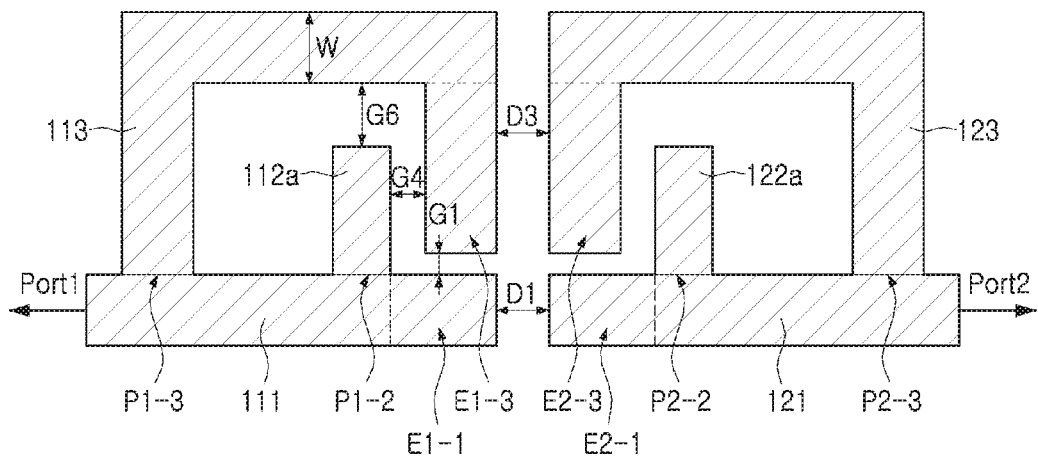
FIG. 2C is a diagram illustrating a radio frequency filter according to an example.

FIG. 2C is a diagram illustrating a radio frequency filter according to an example.

Referring to FIG. 2C, the extended length of the second conductive pattern 112a may be shorter (as compared to the example of FIG. 1) and the extended length of the fifth conductive pattern 122a may be shorter (as compared to the example of FIG. 1). A separation distance G6 in a direction extending from one end of the second conductive pattern 112a to the third conductive pattern 113 may be longer (as compared to the example of FIG. 1), and a separation distance in a direction extending from the fifth conductive pattern 122a to the sixth conductive pattern 123 may be longer (as compared to the example of FIG. 1).

A separation distance D3 between the third conductive pattern 113 and the sixth conductive pattern 123 may be longer than a separation distance G4 in a lateral direction between the third conductive pattern 113 and the second conductive pattern 112a, and may be longer than a separation distance in a lateral direction between the sixth conductive pattern 123 and the fifth conductive pattern 122a.

Since the second conductive pattern 112a and the third conductive pattern 113 may be more stably coupled to each other, stable impedance may result. Since the fifth conductive pattern 122a and the sixth conductive pattern 123 may be more stably coupled to each other, stable impedance may result.

Figure 2D:
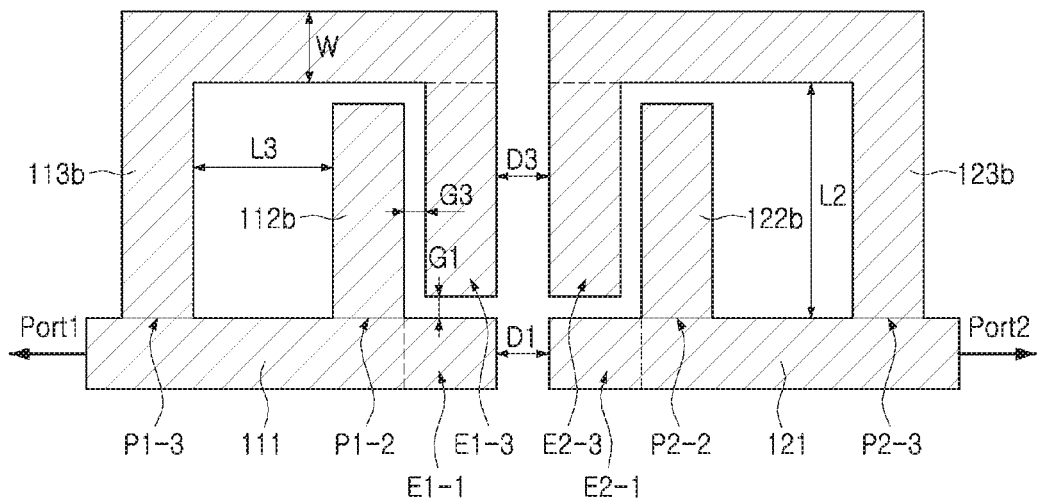
FIG. 2D is a diagram illustrating a radio frequency filter according to an example.

FIG. 2D is a diagram illustrating a radio frequency filter according to an example.

Referring to FIG. 2D, a longitudinal length in a direction L2 of each of a second conductive pattern 112b, a third conductive pattern 113b, a fifth conductive pattern 122b, and a sixth conductive pattern 123b may be longer (as compared to the example of FIG. 1).

An inductance and a capacitance of each of the second conductive pattern 112b, the third conductive pattern 113b, the fifth conductive pattern 122b, and the sixth conductive pattern 123b may be increased.

An extended length at the first point P1-2 of the first conductive pattern 111 may be shorter than a distance L3 between the first point P1-2 and the second point P1-3, and an extended length at the third point P2-2 of the fourth conductive pattern 121 may be shorter than a distance between the third point P2-2 and the fourth point P2-3.

A capacitance change rate according to an extended length of the extended region E1-1 of the first conductive pattern 111 and a capacitance change rate according to an extended length of the extended region E2-1 of the fourth conductive pattern 121 may be each stable. The radio frequency filter may have a more stable bandwidth.

The width of the first conductive pattern 111 may be greater than the separation distance G3 in the lateral direction between the second conductive pattern 112b and the third conductive pattern 113b and may be shorter than a lateral separation distance L3 between the second conductive pattern 112b and the third conductive pattern 113b, and the width of the fourth conductive pattern 121 may be greater than the separation distance in the lateral direction between the fifth conductive pattern 122b and the sixth conductive pattern 123b and may be shorter than a lateral separation distance between the fifth conductive pattern 122b and the sixth conductive pattern 123b. The resonance frequency and the bandwidth of the radio frequency filter may be more easily designed.

Figure 3A:
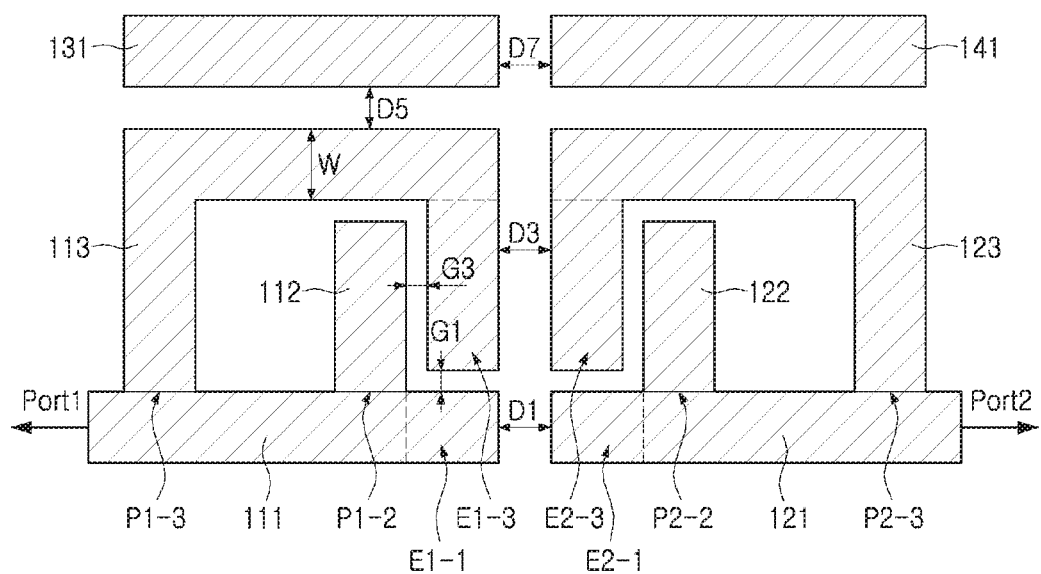
FIG. 3A is a diagram illustrating a radio frequency filter according to an example.

FIG. 3A is a diagram illustrating a radio frequency filter according to an example.

Referring to FIG. 3A, the radio frequency filter may further include a seventh conductive pattern 131 and an eighth conductive pattern 141.

The seventh conductive pattern 131 may be extended so as to be in parallel to at least a portion of the third conductive pattern 113. Since the seventh conductive pattern 131 may be electromagnetically coupled to the third conductive pattern 113, an additional capacitance may be provided. The additional capacitance may be varied depending on a separation distance D5 between the seventh conductive pattern 131 and the third conductive pattern 113. For example, the separation distance D5 between the seventh conductive pattern 131 and the third conductive pattern 113 may be about 0.115 mm, but is not limited to such a distance.

The eighth conductive pattern 141 may be extended so as to be in parallel to at least a portion of the sixth conductive pattern 123. Since the eighth conductive pattern 141 may be electromagnetically coupled to the sixth conductive pattern 123, an additional capacitance may be provided. The additional capacitance may be varied depending on a separation distance between the eighth conductive pattern 141 and the sixth conductive pattern 123.

A separation distance D7 between the seventh conductive pattern 131 and the eighth conductive pattern 141 may be less than or equal to the separation distance D1 between the first conductive pattern 111 and the fourth conductive pattern 121 and may be less than or equal to the separation distance D3 between the third conductive pattern 113 and the sixth conductive pattern 123. Since the seventh conductive pattern 131 and the eighth conductive pattern 141 may be electromagnetically coupled to each other, an additional capacitance may be provided. For example, the separation distance D7 between the seventh conductive pattern 131 and the eighth conductive pattern 141 may be about 0.055 mm, but is not limited to such a distance.

The additional capacitance provided by the seventh conductive pattern 131 and the eighth conductive pattern 141 may act in a similar manner as the capacitance provided by the extended region E1-1 of the first conductive pattern 111 and the extended region E2-1 of the fourth conductive pattern 121. The radio frequency filter may provide the additional capacitance through the seventh conductive pattern 131 and the eighth conductive pattern 141 without having the extended region E1-1 of the first conductive pattern 111 and the extended region E2-1 of the fourth conductive pattern 121 to thereby have a more improved skirt characteristic and a more finely adjusted bandwidth.

Figure 3B:
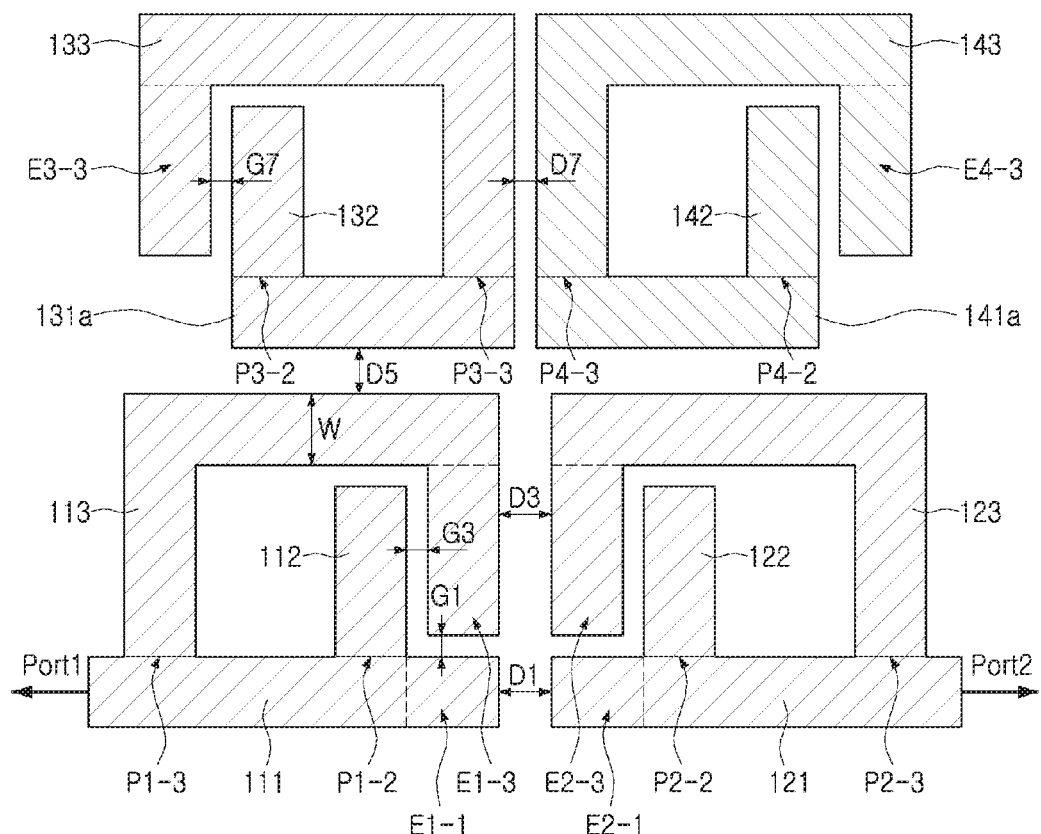
FIG. 3B is a diagram illustrating a radio frequency filter according to an example.

FIG. 3B is a diagram illustrating a radio frequency filter according to an example.

Referring to FIG. 3B, the radio frequency filter may further include a ninth conductive pattern 132, a tenth conductive pattern 133, an eleventh conductive pattern 142, and a twelfth conductive pattern 143.

The ninth conductive pattern 132 may be connected to a fifth point P3-2 of the seventh conductive pattern 131a and be extended therefrom, and may provide an additional inductance corresponding to an extended length of the ninth conductive pattern 132.

The tenth conductive pattern 133 may be connected to a sixth point P3-3 of the seventh conductive pattern 131a and be extended so as to surround at least a portion of the ninth conductive pattern 132, and may provide an inductance corresponding to an extended length of the tenth conductive pattern 133. Since at least a portion of the tenth conductive pattern 133 may be electromagnetically coupled to the ninth conductive pattern 132, an additional inductance may be provided.

The eleventh conductive pattern 142 may be connected to a seventh point P4-2 of an eighth conductive pattern 141a and be extended therefrom. The eleventh conductive pattern 142 and the ninth conductive pattern 132 may have bilateral symmetry with respect to each other, but may have bilateral asymmetry depending on a resonance frequency design.

The twelfth conductive pattern 143 may be connected to an eighth point P4-3 of the eighth conductive pattern 141a and be extended to surround at least a portion of the eleventh conductive pattern 142. The twelfth conductive pattern 143 and the tenth conductive pattern 133 may have bilateral symmetry with respect to each other, but may have bilateral asymmetry depending on a resonance frequency design.

The radio frequency filter may have additional impedance according to the ninth conductive pattern 132, the tenth conductive pattern 133, the eleventh conductive pattern 142, and the twelfth conductive pattern 143 to thereby have an improved skirt characteristic and a more finely adjusted bandwidth.

A separation distance D7 between the tenth conductive pattern 133 and the twelfth conductive pattern 143 may be less than or equal to the separation distance D3 between the third conductive pattern 113 and the sixth conductive pattern 123. Since the seventh conductive pattern 131a to the twelfth conductive pattern 143 may have a larger influence on the radio frequency signal passing between the first port Port1 and the second port Port2, the respective components of the radio frequency filter may operate in a more balanced manner.

For example, the separation distance D5 between the third conductive pattern 113 and the seventh conductive pattern 131a may be longer than the separation distance D7 between the tenth conductive pattern 133 and the twelfth conductive pattern 143 and may be shorter than the separation distance D3 between the third conductive pattern 113 and the sixth conductive pattern 123. The separation distance between the sixth conductive pattern 123 and the eighth conductive pattern 141a may be longer than the separation distance D7 between the tenth conductive pattern 133 and the twelfth conductive pattern 143 and may be shorter than the separation distance D3 between the third conductive pattern 113 and the sixth conductive pattern 123. The respective components of the radio frequency filter may operate in a more balanced manner.

A separation distance G7 in a lateral direction between the ninth conductive pattern 132 and the tenth conductive pattern 133 may be about 0.045 mm, but is not limited to such a distance.

Figure 3C:
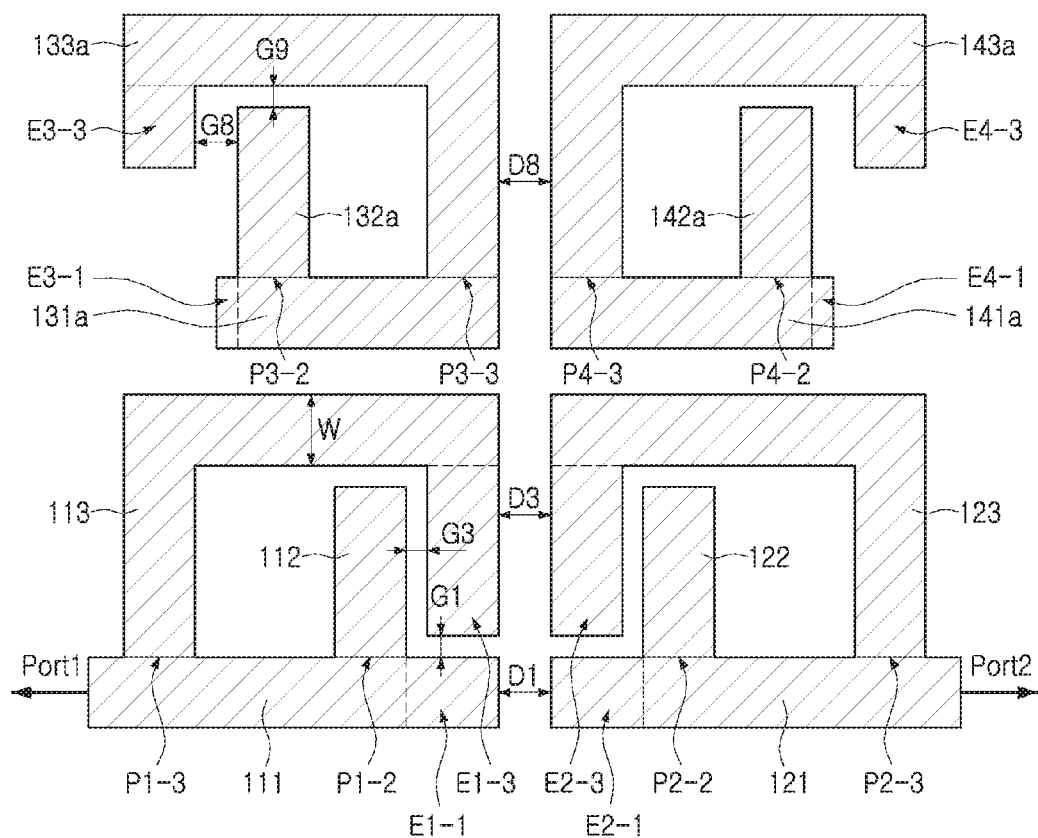
FIG. 3C is a diagram illustrating a radio frequency filter according to an example.

FIG. 3C is a diagram illustrating a radio frequency filter according to an example.

Referring to FIG. 3C, a ninth conductive pattern 132a may be disposed so that a separation distance G8 in a lateral direction between the ninth conductive pattern 132a and a tenth conductive pattern 133a is longer (as compared to the example of FIG. 3B), and an eleventh conductive pattern 142a may be disposed so that a separation distance in a lateral direction between the eleventh conductive pattern 142a and a twelfth conductive pattern 143a is longer (as compared to the example of FIG. 3B). An extended region E3-1 of the seventh conductive pattern 131a and an extended region E4-1 of the eighth conductive pattern 141a may each be included. A separation distance G9 in a direction extending from the ninth conductive pattern 132a to the tenth conductive pattern 133a may be varied depending on a resonance frequency design.

A length of an extended region E3-3 of the tenth conductive pattern 133a may be shorter (as compared to the example of FIG. 3B) and a length of an extended region E4-3 of the twelfth conductive pattern 143a may be shorter (as compared to the example of FIG. 3B). A capacitance between the tenth conductive pattern 133a and the ninth conductive pattern 132a may be reduced, and a capacitance between the twelfth conductive pattern 143a and the eleventh conductive pattern 142a may be reduced.

A separation distance D8 between the tenth conductive pattern 133a and the twelfth conductive pattern 143a may be equal to the separation distance D3 between the third conductive pattern 113 and the sixth conductive pattern 123.

Figure 3D:
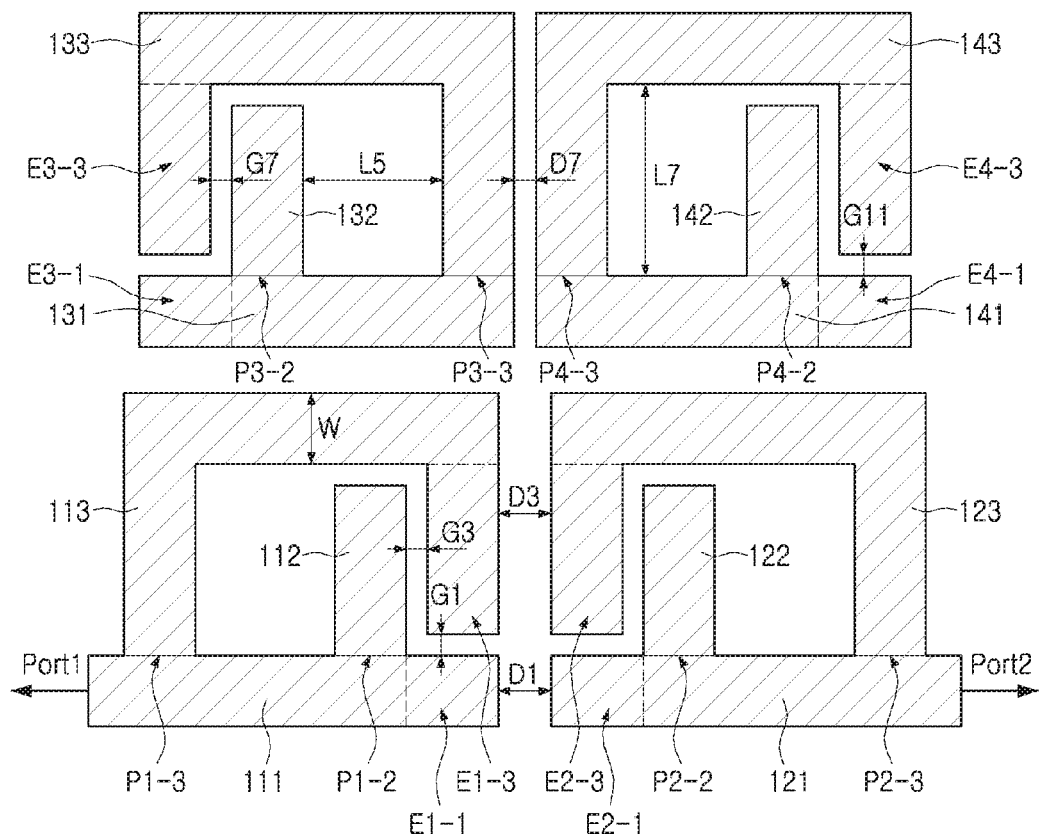
FIG. 3D is a diagram illustrating a radio frequency filter according to an example.

FIG. 3D is a diagram illustrating a radio frequency filter according to an example.

Referring to FIG. 3D, the extended region E3-1 of the seventh conductive pattern 131 may be longer (as compared to the example in FIG. 3C) and the extended region E4-1 of the eighth conductive pattern 141 may be longer (as compared to the example in FIG. 3C). A distance from a left end of the seventh conductive pattern 131a to the fifth point P3-2 may be shorter than a distance L5 from the fifth point P3-2 to the sixth point P3-3, and a distance from a right end of the eighth conductive pattern 141a to the seventh point P4-2 may be shorter than a distance from the seventh point P4-2 to the eighth point P4-3.

The extended region E3-1 of the seventh conductive pattern 131 may act in a similar manner to that of the extended region E1-1 of the first conductive pattern 111, and the extended region E4-1 of the eighth conductive pattern 141 may act in a similar manner to that of the extended region E2-1 of the fourth conductive pattern 121. The radio frequency filter may have an improved skirt characteristic and may have a more finely adjusted bandwidth by the additional capacitance according to the extended region E3-1 of the seventh conductive pattern 131 and the extended region E4-1 of the eighth conductive pattern 141.

The longitudinal length in direction L7 of each of the ninth conductive pattern 132, the tenth conductive pattern 133, the eleventh conductive pattern 142, and the twelfth conductive pattern 143 may be longer. Accordingly, some inductance of the radio frequency filter may be increased.

Figure 4A:
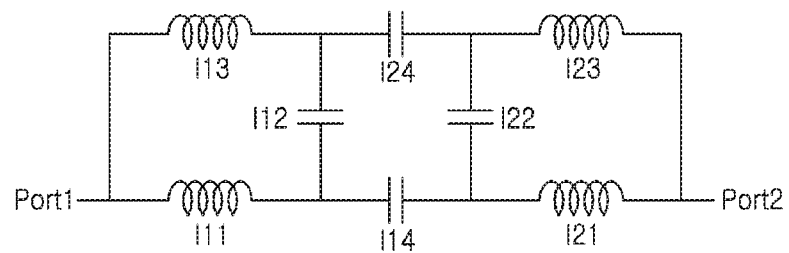
FIG. 4A is a diagram illustrating an equivalent circuit of a radio frequency filter according to an example.

FIG. 4A is a diagram illustrating an equivalent circuit of a radio frequency filter according to an example.

Referring to FIG. 4A, the first conductive pattern may be modeled with an inductance 111, the third conductive pattern may be modeled with an inductance 113, and the space between the second conductive pattern and the third conductive pattern may be modeled with a capacitance 112.

The fourth conductive pattern may be modeled with an inductance 121, the sixth conductive pattern may be modeled with an inductance 123, and the space between the fifth conductive pattern and the sixth conductive pattern may be modeled with a capacitance 122.

A space between the extended region of the third conductive pattern and the extended region of the fourth conductive pattern may be modeled with a capacitance 114. The radio frequency filter may have the capacitance 114 by adjusting the extended length of the third conductive pattern and the extended length of the fourth conductive pattern.

A space between the third conductive pattern and the sixth conductive pattern may be modeled with a capacitance 124. The capacitance 124 may be extended by adding the seventh conductive pattern to the twelfth conductive pattern.

Figure 4B:
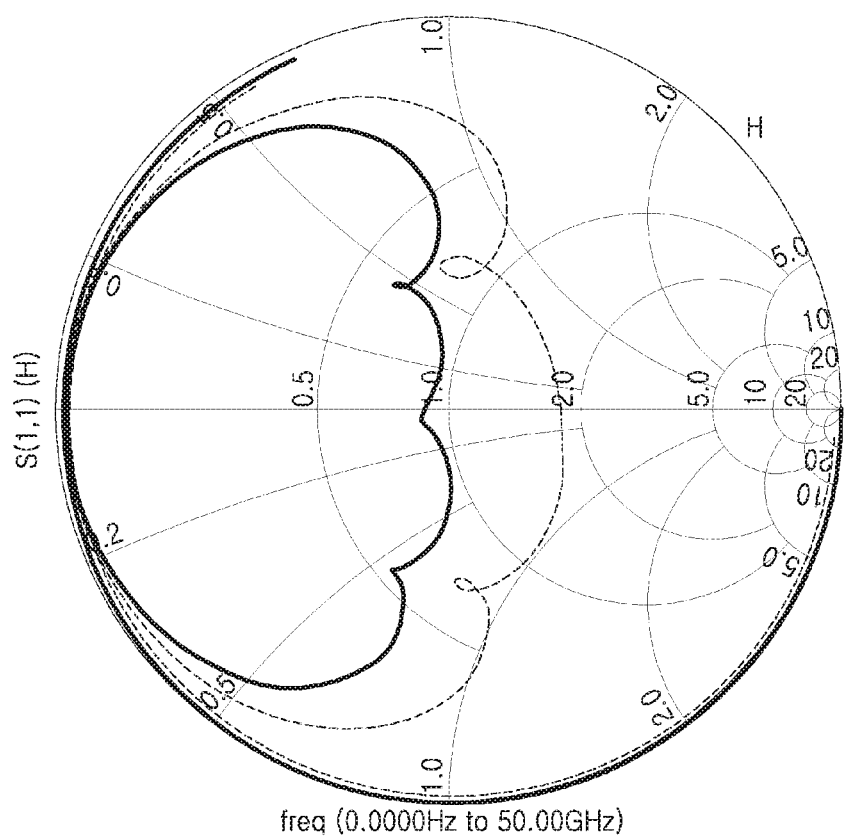
FIGS. 4B through 4D are diagrams illustrating a change in an S-parameter in a radio frequency filter according to an example.
Figure 4C:
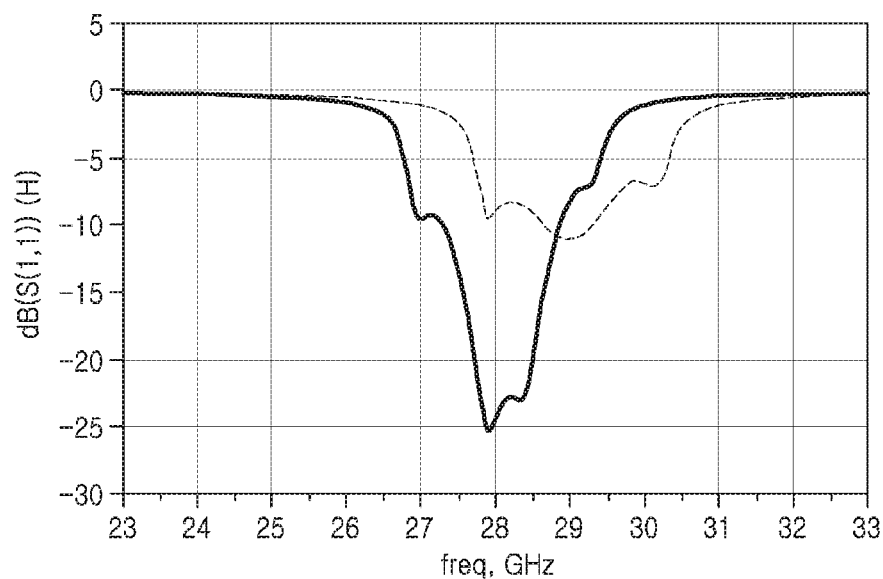
Figure 4D:
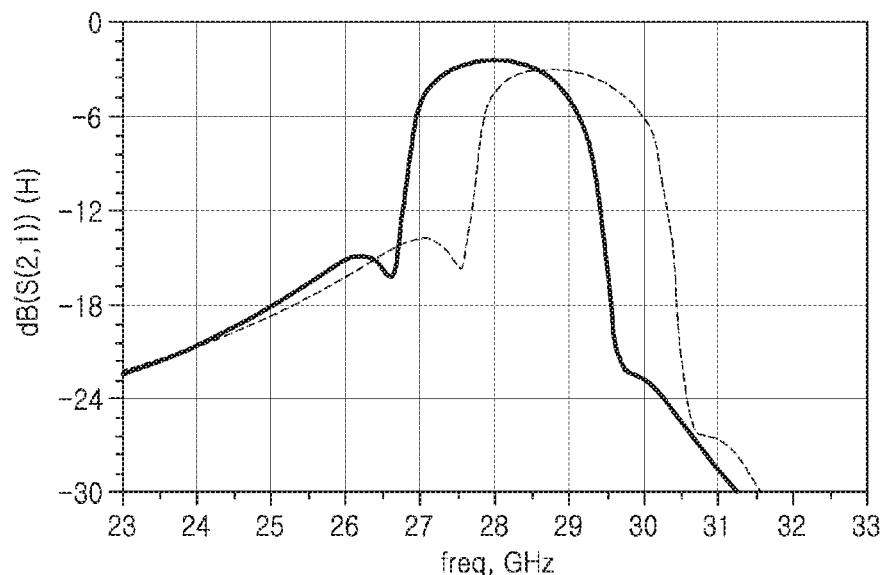

FIGS. 4B through 4D are diagrams illustrating a change of an S-parameter according to a radio frequency filter according to an example.

Referring to FIG. 4B, a dotted line curve shows characteristic impedance according to frequencies of 0 GHz to 50 GHz when the extended region of the third conductive pattern and the extended region of the fourth conductive pattern are not present, and a solid line curve shows the characteristic impedance according to the frequencies of 0 GHz to 50 GHz when the extended region of the third conductive pattern and the extended region of the fourth conductive pattern are present.

In the case in which the extended region of the third conductive pattern and the extended region of the fourth conductive pattern are present, the characteristic impedance at about 28 GHz may have a value (a center value in a graph) close to the characteristic impedances of the first and second ports.

Referring to FIG. 4C, a dotted line curve shows return loss according to frequencies of 23 GHz to 33 GHz when the extended region of the third conductive pattern and the extended region of the fourth conductive pattern are not present, and a solid line curve shows the return loss according to the frequencies of 23 GHz to 33 GHz when the extended region of the third conductive pattern and the extended region of the fourth conductive pattern are present.

In the case in which the extended region of the third conductive pattern and the extended region of the fourth conductive pattern are present, the return loss at the frequency of about 28 GHz may be lower.

Referring to FIG. 4D, a dotted line curve shows insertion loss according to frequencies of 23 GHz to 33 GHz when the extended region of the third conductive pattern and the extended region of the fourth conductive pattern are not present, and a solid line curve shows the insertion loss according to the frequencies of 23 GHz to 33 GHz when the extended region of the third conductive pattern and the extended region of the fourth conductive pattern are present.

In the case in which the extended region of the third conductive pattern and the extended region of the fourth conductive pattern are present, the insertion loss at the frequency of about 28 GHz may be lower.

FIG. 5 is a diagram illustrating a filter layer on which a radio frequency filter according to an example is arranged.

Referring to FIG. 5, a filter layer may include a plurality of radio frequency filters 101, 103, 105, and 107. The plurality of radio frequency filters 101, 103, 105, and 107 may correspond to the radio frequency filters described above with reference to FIGS. 1 through 4D.

A plurality of filter ground layers 151, 152, 153, and 154 may disposed between the plurality of radio frequency filters 101, 103, 105, and 107. Accordingly, electromagnetic isolation between the plurality of radio frequency filters 101, 103, 105, and 107 may be improved.

Since the radio frequency filter may have a reduced size while securing a filter performance, layout spaces of the plurality of filter ground layers 151, 152, 153, and 154 may be easily extended. Accordingly, the electromagnetic isolation between the plurality of radio frequency filters 101, 103, 105, and 107 may be further improved.

Each of a plurality of lower vias 161, 163, 165, and 167 may be electrically connected to a first port of each of the plurality of radio frequency filters 101, 103, 105, and 107, and each of a plurality of upper vias 162, 164, 166, and 168 may be electrically connected to a second port of each of the plurality of radio frequency filters 101, 103, 105, and 107.

Figure 6:
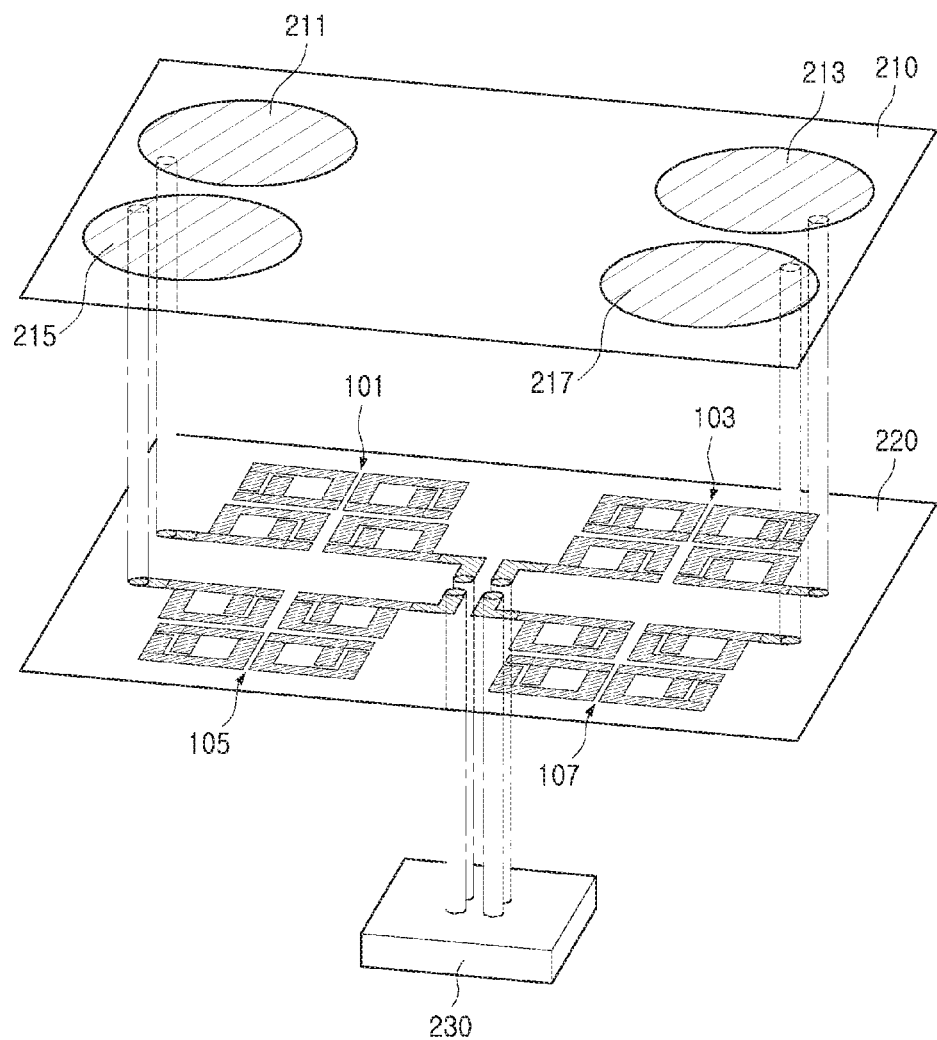
FIG. 6 is a diagram illustrating an antenna layer and an integrated circuit (IC) connected to a filter layer on which a radio frequency filter according to an example is arranged.

FIG. 6 is a diagram illustrating an antenna layer and an integrated circuit (IC) connected to the filter layer on which the radio frequency filter according to an example is arranged.

Referring to FIG. 6, a radio frequency module according to an example may include an antenna layer 210, a filter layer 220, and an integrated circuit (IC) 230.

The antennal layer 210 may include a plurality of patch antennas 211, 213, 215, and 217, which are each electrically connected to the IC 230. Each of the plurality of patch antennas 211, 213, 215, and 217 may be electrically connected to each of the plurality of upper vias described above.

The filter layer 220 may be the same as the filter layer illustrated in FIG. 5 and may be disposed between the antenna layer 210 and the IC 230. The radio frequency filter may be disposed outside of the IC 230 and may be electrically adjacent to the plurality of patch antennas 211, 213, 215, and 217 to filter the radio frequency signals.

The IC 230 may perform at least some of a frequency conversion, amplification, filtering, a phase control, and a power generation to thereby generate a converted radio frequency signal.

Figure 7:
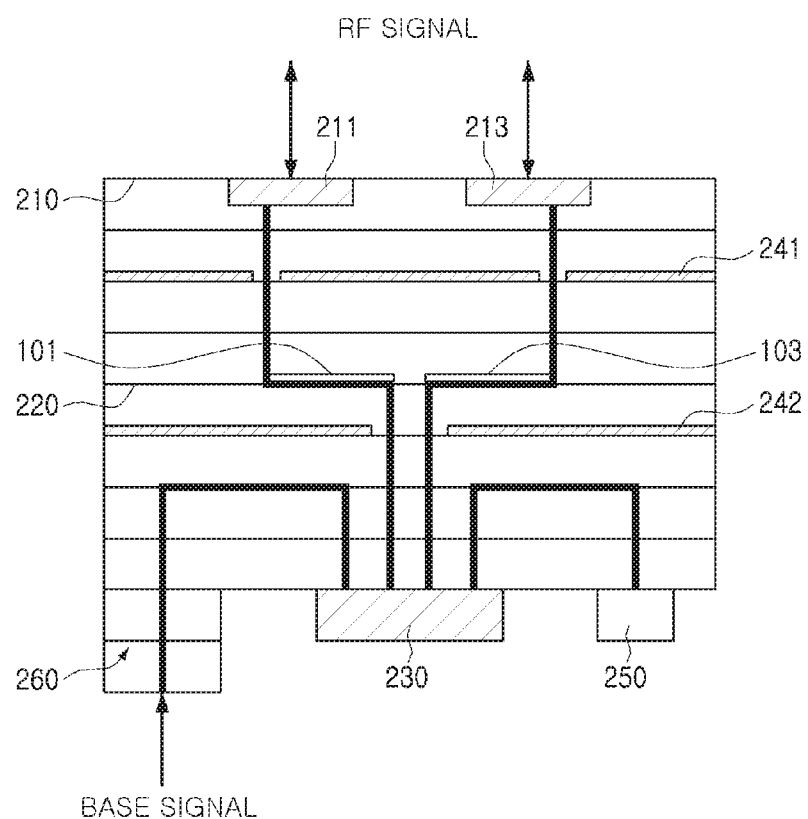
FIG. 7 is a diagram illustrating a radio frequency module according to an example.

FIG. 7 is a diagram illustrating a radio frequency module according to an example.

Referring to FIG. 7, the radio frequency module may further include an upper ground layer 241, a lower ground layer 242, a passive component 250, and a core member 260.

The upper ground layer 241 may be disposed between the antenna layer 210 and the filter layer 220 and may overlap the plurality of radio frequency filters 101 and 103 together when viewed in a vertical direction. The electromagnetic isolation between the plurality of radio frequency filters 101 and 103 and the plurality of patch antennas 211 and 213 may be improved.

The lower ground layer 242 may be disposed between the filter layer 220 and the IC 230 and may overlap the plurality of radio frequency filters 101 and 103 together when viewed in a vertical direction. The electromagnetic isolation between the plurality of radio frequency filters 101 and 103 and the IC 230 may be improved.

The passive component 250 may be disposed on a lower surface of the radio frequency module and may be electrically connected to the IC 230 to provide impedance. For example, the passive component 250 may include at least a portion of a capacitor (e.g., a multilayer ceramic capacitor (MLCC)), an inductor, and a chip resistor. At least portions of the passive component 250 and the IC 230 may be encapsulated by an encapsulant (e.g., a photo imagable encapsulant (PIE), an Ajinomoto Build-up film (ABF), or an epoxy molding compound (EMC)).

The core member 260 may be configured so that a base signal passes through the core member 260. For example, the core member 260 may include core vias through which the base signal passes, and may include electrical connection structures (e.g., solder balls, pins, and lands) electrically connected to the core vias and connected to the outside.

The IC 230 may receive the base signal through the core member 260 and may transmit a radio frequency signal having a frequency higher than the frequency of the base signal to the plurality of patch antennas 211 and 213.

The base signal may be an intermediate frequency (IF) signal or a baseband signal and may have frequencies (e.g., 2 GHz, 5 GHz, 10 GHz, and the like) lower than the frequencies (e.g., 24 GHz, 28 GHz, 36 GHz, 39 GHz, and 60 GHz) of the radio frequency signal.

Figure 8A:
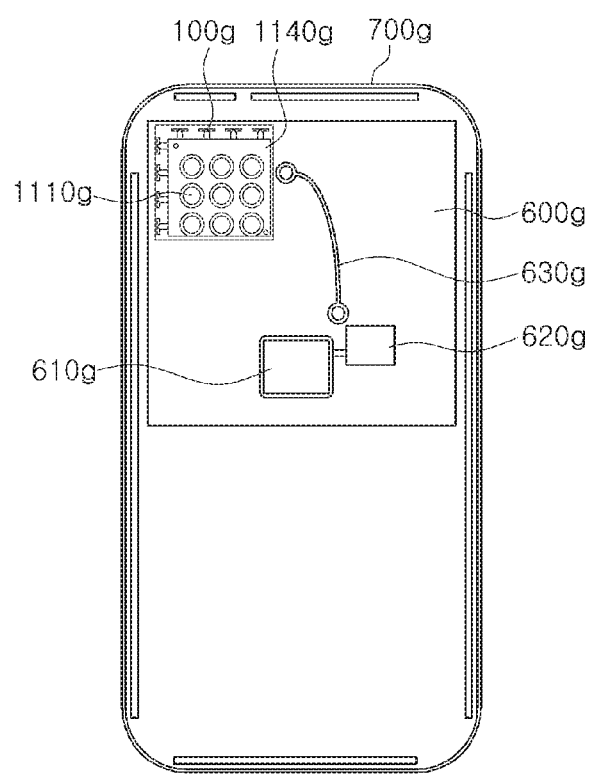
FIGS. 8A and 8B are plan views illustrating layouts of a radio frequency module in an electronic device according to an example.
Figure 8B:
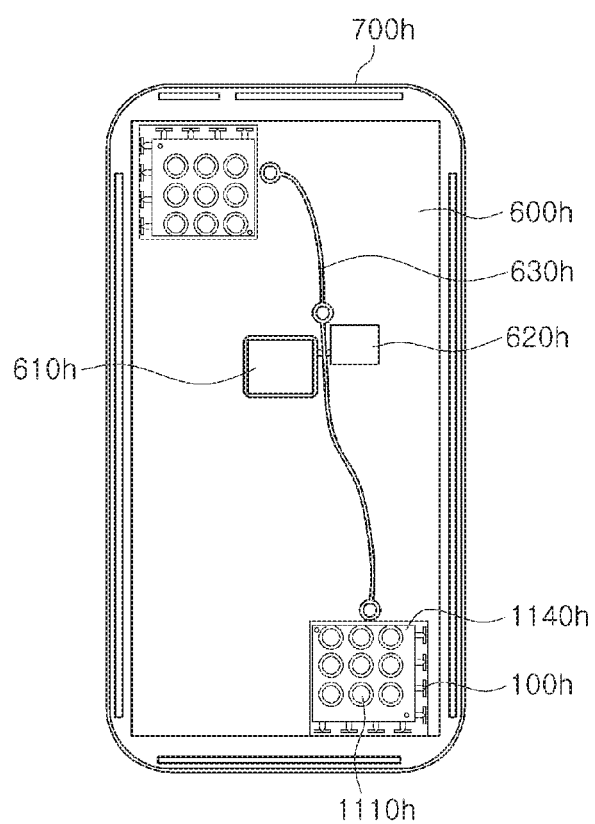

FIGS. 8A and 8B are plan views illustrating layouts of a radio frequency module in an electronic device according to an example.

Referring to FIG. 8A, a radio frequency module including a radio frequency filter 100g, a patch antenna pattern 1110g, and an insulating layer 1140g may be disposed to be adjacent to a side boundary of an electronic device 700g on a set substrate 600g of the electronic device 700g.

The electronic device 700g may be a smartphone, a personal digital assistant, a digital video camera, a digital still camera, a network system, a computer, a monitor, a tablet, a laptop, a netbook, a television, a video game, a smartwatch, an automotive component, or the like, but is not limited to such devices.

A communications module 610g and a baseband circuit 620g may be further disposed on the set substrate 600g. The radio frequency module may be electrically connected to the communications module 610g and/or the baseband circuit 620g through a coaxial cable 630g.

The communications module 610g may include at least a portion of a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an analog-digital converter, an application-specific IC (ASIC), or the like.

The baseband circuit 620g may generate a base signal by performing analog-digital conversion, and amplification, filtering, and frequency conversion of an analog signal. The base signal input to and output from the baseband circuit 620g may be transmitted to the radio frequency module through a cable.

For example, the base signal may be transmitted to the IC through an electrical connection structure, a core via, and a wiring. The IC may convert the base signal into a radio frequency signal of a millimeter wave (mmWave) band.

Referring to FIG. 8B, a plurality of radio frequency modules each including a radio frequency filter 100h, a patch antenna pattern 1110h, and an insulating layer 1140h may be disposed to be adjacent to a boundary of one side surface of an electronic device 700h and a boundary of the other side surface thereof, respectively, on a set substrate 600h of the electronic device 700h. A communications module 610h and a baseband circuit 620h may be further disposed on the set substrate 600h. The plurality of radio frequency modules may be electrically connected to the communications module 610h and/or the baseband circuit 620h through a coaxial cable 630h.

The conductive pattern, the via, the patch antenna, and the ground layer may include a metal material (e.g., a conductive material such as copper (Cu), aluminum (Al), silver (Ag), tin (Sn), gold (Au), nickel (Ni), lead (Pb), titanium (Ti), or an alloy thereof), and may be formed by a plating method such as chemical vapor deposition (CVD), physical vapor deposition (PVD), sputtering, subtractive, additive, semi-additive process (SAP), modified semi-additive process (MSAP), or the like, but is not limited to such configurations.

The insulating layer may be filled in at least a portion of a space between the conductive pattern, the via, the patch antenna, and the ground layer. For example, the insulating layer may be formed of FR4, liquid crystal polymer (LCP), low temperature co-fired ceramic (LTCC), a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), a photo imagable dielectric (PID) resin, generic copper clad laminate (CCL), or a glass or ceramic based insulating material.

Meanwhile, the RF signal may have a format according to wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols, but is not limited to such formats.

The radio frequency filter according to the examples described herein may have more improved skirt characteristics and may have a more finely adjusted bandwidth.

The radio frequency filter according to the examples described herein may have a reduced size while securing a filter performance, and may be efficiently arranged in the radio frequency module.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency module comprising:
    an integrated circuit (IC);
    an antenna layer comprising patch antennas electrically connected to the IC, respectively; and
    a filter layer comprising radio frequency filters electrically connected to corresponding patch antennas among the patch antennas, respectively, and disposed between the IC and the antenna layer,
    wherein at least one of the radio frequency filters comprises
        a first conductive pattern extended from a first port and comprising a first point and a second point;
        a second conductive pattern connected to the first point of the first conductive pattern and extended from the first point;
        a third conductive pattern connected to the second point of the first conductive pattern and extended to surround at least a portion of the second conductive pattern;
        a fourth conductive pattern extended from a second port and comprising a third point and a fourth point;
        a fifth conductive pattern connected to the third point of the fourth conductive pattern and extended from the third point;
        a sixth conductive pattern connected to the fourth point of the fourth conductive pattern and extended to surround at least a portion of the fifth conductive pattern;
        an upper ground layer disposed between the antenna layer and the filter layer and overlapping the radio frequency filters in a vertical direction; and
        a lower ground layer disposed between the filter layer and the IC and overlapping the radio frequency filters in the vertical direction, and
    wherein the first conductive pattern extends toward the fourth conductive pattern from the first point and the fourth conductive pattern extends toward the first conductive pattern from the third point, and
    a separation distance between the first conductive pattern and the fourth conductive pattern is greater than or equal to a separation distance between the third conductive pattern and the sixth conductive pattern.

2. A radio frequency filter comprising:
    a first conductive pattern extended from a first port and comprising a first point and a second point;
    a second conductive pattern connected to the first point of the first conductive pattern and extended from the first point;
    a third conductive pattern connected to the second point of the first conductive pattern and extended to surround at least a portion of the second conductive pattern;
    a fourth conductive pattern extended from a second port and comprising a third point and a fourth point;
    a fifth conductive pattern connected to the third point of the fourth conductive pattern and extended from the third point; and
    a sixth conductive pattern connected to the fourth point of the fourth conductive pattern and extended to surround at least a portion of the fifth conductive pattern,
    wherein the first conductive pattern extends toward the fourth conductive pattern from the first point and the fourth conductive pattern extends toward the first conductive pattern from the third point, and
    a separation distance between the first conductive pattern and the fourth conductive pattern is greater than or equal to a separation distance between the third conductive pattern and the sixth conductive pattern, and
    wherein a length of an extended portion of the first conductive pattern that extends toward the fourth conductive pattern from the first point is shorter than a distance between the first point and the second point, and
    a length of an extended portion of the fourth conductive pattern that extends toward the first conductive pattern from the third point is shorter than a distance between the third point and the fourth point.

3. The radio frequency filter of claim 2, wherein a width of the first conductive pattern is greater than a separation distance between the second conductive pattern and the third conductive pattern in a first lateral direction, and is less than a separation distance between the second conductive pattern and the third conductive pattern in a second lateral direction, and
    a width of the fourth conductive pattern is greater than a separation distance between the fifth conductive pattern and the sixth conductive pattern in a third lateral direction, and is less than a separation direction between the fifth conductive pattern and the sixth conductive pattern in a fourth lateral direction.

4. The radio frequency filter of claim 2, wherein a separation distance between one end of the second conductive pattern and the third conductive pattern is equal to a separation distance between the second conductive pattern and the third conductive pattern in a first lateral direction, and a separation distance between one end of the fifth conductive pattern and the sixth conductive pattern is equal to a separation distance between the fifth conductive pattern and the sixth conductive pattern in a second lateral direction.

5. The radio frequency filter of claim 2, wherein a separation distance between one end of the third conductive pattern and the first conductive pattern is equal to a separation distance between the second conductive pattern and the third conductive pattern in a first lateral direction, and a separation distance between one end of the sixth conductive pattern and the fourth conductive pattern is equal to a separation distance between the fifth conductive pattern and the sixth conductive pattern in a second lateral direction.

6. The radio frequency filter of claim 5, wherein a separation distance between the third conductive pattern and the sixth conductive pattern is greater than the separation distance between the second conductive pattern and the third conductive pattern in the first lateral direction, and is greater than the separation distance between the fifth conductive pattern and the sixth conductive pattern in the second lateral direction.

7. The radio frequency filter of claim 2, further comprising:

a seventh conductive pattern electromagnetically coupled to at least a portion of the third conductive pattern; and an eighth conductive pattern electromagnetically coupled to at least a portion of the sixth conductive pattern, wherein a separation distance between the seventh conductive pattern and the eighth conductive pattern is less than or equal to the separation distance between the first conductive pattern and the fourth conductive pattern.

8. The radio frequency filter of claim 7, further comprising:

a ninth conductive pattern connected to a fifth point of the seventh conductive pattern and extended from the fifth point;

a tenth conductive pattern connected to a sixth point of the seventh conductive pattern and extended to surround at least a portion of the ninth conductive pattern;

an eleventh conductive pattern connected to a seventh point of the eighth conductive pattern and extended from the seventh point; and a twelfth conductive pattern connected to an eighth point of the eighth conductive pattern and extended to surround at least a portion of the eleventh conductive pattern, wherein a separation distance between the tenth conductive pattern and the twelfth conductive pattern is less than or equal to the separation distance between the third conductive pattern and the sixth conductive pattern.

9. The radio frequency filter of claim 8, wherein a distance from one end of the seventh conductive pattern to the fifth point is less than a distance from the fifth point to the sixth point, and a distance from one end of the eighth conductive pattern to the seventh point is less than a distance from the seventh point to the eighth point.

10. The radio frequency filter of claim 8, wherein a separation distance between the third conductive pattern and the seventh conductive pattern is greater than a separation distance between the tenth conductive pattern and the twelfth conductive pattern and is less than the separation distance between third conductive pattern and the sixth conductive pattern, and a separation distance between the sixth conductive pattern and the eighth conductive pattern is greater than the separation distance between the tenth conductive pattern and the twelfth conductive pattern and is less than the separation distance between third conductive pattern and the sixth conductive pattern.

11. A radio frequency filter comprising:

a first conductive pattern extended from a first port and comprising a first point and a second point;

a second conductive pattern connected to the first point of the first conductive pattern and extended from the first point;

a third conductive pattern connected to the second point of the first conductive pattern and extended to surround at least a portion of the second conductive pattern;

a fourth conductive pattern extended from a second port and comprising a third point and a fourth point;

a fifth conductive pattern connected to the third point of the fourth conductive pattern and extended from the third point;

a sixth conductive pattern connected to the fourth point of the fourth conductive pattern and extended to surround at least a portion of the fifth conductive pattern;

a seventh conductive pattern electromagnetically coupled to at least a portion of the third conductive pattern;

an eighth conductive pattern electromagnetically coupled to at least a portion of the sixth conductive pattern;

a ninth conductive pattern connected to a fifth point of the seventh conductive pattern and extended from the fifth point;

a tenth conductive pattern connected to a sixth point of the seventh conductive pattern and extended to surround at least a portion of the ninth conductive pattern;

an eleventh conductive pattern connected to a seventh point of the eighth conductive pattern and extended from the seventh point; and a twelfth conductive pattern connected to an eighth point of the eighth conductive pattern and extended to surround at least a portion of the eleventh conductive pattern, wherein a separation distance between the seventh conductive pattern and the eighth conductive pattern is less than or equal to a separation distance between the third conductive pattern and the sixth conductive pattern, a separation distance between the tenth conductive pattern and the twelfth conductive pattern is less than or equal to the separation distance between the third conductive pattern and the sixth conductive pattern, a separation distance between the third conductive pattern and the seventh conductive pattern is greater than the separation distance between the tenth conductive pattern and the twelfth conductive pattern and is less than the separation distance between the third conductive pattern and the sixth conductive pattern, and a separation distance between the sixth conductive pattern and the eighth conductive pattern is greater than the separation distance between the tenth conductive pattern and the twelfth conductive pattern and is less than the separation distance between the third conductive pattern and the sixth conductive pattern.

12. A radio frequency module comprising:
an integrated circuit (IC);
an antenna layer comprising patch antennas electrically connected to the IC, respectively; and
a filter layer comprising radio frequency filters electrically connected to corresponding patch antennas among the patch antennas, respectively, and disposed between the IC and the antenna layer,
wherein at least one of the radio frequency filters comprises
  a first conductive pattern extended from a first port and comprising a first point and a second point;
  a second conductive pattern connected to the first point of the first conductive pattern and extended from the first point;
  a third conductive pattern connected to the second point of the first conductive pattern and extended to surround at least a portion of the second conductive pattern;
  a fourth conductive pattern extended from a second port and comprising a third point and a fourth point;
  a fifth conductive pattern connected to the third point of the fourth conductive pattern and extended from the third point; and
  a sixth conductive pattern connected to the fourth point of the fourth conductive pattern and extended to surround at least a portion of the fifth conductive pattern,
wherein the first conductive pattern extends toward the fourth conductive pattern from the first point and the fourth conductive pattern extends toward the first conductive pattern from the third point, and
a separation distance between the first conductive pattern and the fourth conductive pattern is greater than or equal to a separation distance between the third conductive pattern and the sixth conductive pattern; and
a core member configured to pass a base signal,
wherein the first conductive pattern extends toward the fourth conductive pattern from the first point and the fourth conductive pattern extends toward the first conductive pattern from the third point,
a separation distance between the first conductive pattern and the fourth conductive pattern is greater than or equal to a separation distance between the third conductive pattern and the sixth conductive pattern, and
the IC receives the base signal through the core member and transmits a radio frequency signal having a frequency higher than a frequency of the base signal to the patch antennas.

13. An electronic device comprising:
the radio frequency module of claim 12; and
a communications module electrically connected to the radio frequency module.

* * * * *